United States Patent
Han

(10) Patent No.: US 10,109,688 B2
(45) Date of Patent: Oct. 23, 2018

(54) REPAIR STRUCTURE OF LINE DEFECT OF AMOLED DISPLAY PANEL AND REPAIR METHOD

(71) Applicant: Shenzhen China Star Optoelectronics Technology Co., Ltd., Shenzhen (CN)

(72) Inventor: Baixiang Han, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 291 days.

(21) Appl. No.: 15/105,576

(22) PCT Filed: Apr. 25, 2016

(86) PCT No.: PCT/CN2016/080102
§ 371 (c)(1),
(2) Date: Jun. 17, 2016

(87) PCT Pub. No.: WO2017/161623
PCT Pub. Date: Sep. 28, 2017

(65) Prior Publication Data
US 2018/0102396 A1    Apr. 12, 2018

(30) Foreign Application Priority Data
Mar. 24, 2016    (CN) .......................... 2016 1 0178046

(51) Int. Cl.
*H01L 27/32*       (2006.01)
*G09G 3/00*        (2006.01)
*H01L 21/66*       (2006.01)
*H01L 21/768*      (2006.01)

(52) U.S. Cl.
CPC ......... *H01L 27/3244* (2013.01); *G09G 3/006* (2013.01); *H01L 21/768* (2013.01); *H01L 22/30* (2013.01); *H01L 2251/568* (2013.01)

(58) Field of Classification Search
CPC ................. H01L 27/3244; H01L 22/30; H01L 2251/568; G09G 3/006
See application file for complete search history.

(56) References Cited

U.S. PATENT DOCUMENTS

2016/0163244 A1*   6/2016   Huang .................... G09G 3/006
                                                    324/760.02
2016/0204181 A1*   7/2016   So ....................... H01L 27/3276
                                                    257/40

* cited by examiner

*Primary Examiner* — Hoang-Quan Ho
(74) *Attorney, Agent, or Firm* — Leong C. Lei

(57) ABSTRACT

The present invention provides a repair structure of a line defect of an AMOLED display panel and a repair method. The conductive film (410) correspondingly overlaps and covers above the test TFT (310) and is insulated from the test TFT (310), and the repair line (420) is insulated and crossed with all the signal fanout lines (200) and the corresponding test line (330). It is realized that the repair line is directly grafted on the AMOLED display panel detecting circuit, which can utilize the present detecting circuit layout of the AMOLED display panel capable of introducing the repair line for having the repair function and saving the layout space, and has no additional requirement to the control IC, and particularly, can be applicable for the line defect repair of the small size, high resolution AMOLED display panel.

13 Claims, 3 Drawing Sheets

REPAIR STRUCTURE OF LINE DEFECT OF AMOLED DISPLAY PANEL AND REPAIR METHOD

FIELD OF THE INVENTION

The present invention relates to a display technology field, and more particularly to a repair structure of a line defect of an AMOLED display panel and a repair method.

BACKGROUND OF THE INVENTION

The Organic Light Emitting Display (OLED) panel possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display panel.

The OLED panel can be categorized into two major types according to the driving methods, which are the Passive Matrix OLED (PMOLED) and the Active Matrix OLED (AMOLED), i.e. two types of the direct addressing and the Thin Film Transistor (TFT) matrix addressing. The AMOLED comprises pixels aligned in array, which belongs to the active display type and the illumination efficiency is high.

Before the AMOLED display panel leaves the factory after the manufacture is accomplished, it has to pass the Cell Test (CT) for detecting whether the thin film transistors of controlling the respective pixels in the AMOLED display panel normally work or not, and whether the scan lines and the data lines of transmitting signals to the respective thin film transistors are normal or not. Therefore, the panel detecting circuit is generally located outside the display region of the AMOLED display panel.

FIG. 1 is a diagram of a detecting circuit of an AMOLED display panel detecting circuit according to prior art. The AMOLED display panel detecting circuit according to prior art comprises a plurality of signal lines 100', a plurality of signal fanout lines 200' correspondingly coupled to the signal lines 100', a plurality of test TFTs 310' correspondingly coupled to the signal lines 100', a test control line 320' coupled to all the test TFTs 310' and a plurality of test lines 330'. The test TFT 310' comprises a gate, a source 312', an active layer 313' and a drain 314', wherein the test control lines 320' serve as all the gates, and the sources 312', the drains 314' and the signal lines 100' are at the same layer, and one drain 314' is correspondingly coupled to one signal line 100', and the sources 312' of all the test TFTs 310' in charge of testing pixels of the same color are correspondingly coupled to one test line 330'. As the AMOLED display panel detecting circuit starts working, the test control line 320' receives the test control signal provided by the panel test terminal and activates all the test TFTs 310'. Meanwhile, the test line 330' receives the test signal provided by the panel test terminal, and transmits the same to the corresponding signal line 100' through the test TFT 310' for testing whether the panel works normally or not. As the detection is finished, the panel test terminal stops providing the test control signal and the test signal. The test control signal line 320' receives no signal and the test TFT 310' is deactivated. The display panel normally displays. The AMOLED display panel detecting circuit according to prior art occupies a certain layout space but merely for the detection.

At present, the defect repair of the AMOLD display panel, and particularly the line defect repair is relatively more difficult. Generally, only the bright line can be repaired to be the dark line, which will influence the quality of the AMOLED display panel. Thus, it is necessary to design the repair circuit for promoting the yield as possible. As regarding the repair circuit of the line defect of the AMOLED display panel according to prior art, the repair bus and the repair line are commonly added into the display panel. Not only more layout space is occupied but the signal of the defect signal line needs to be sent back to the control IC for control. The additional requirement exists for the control IC, which is not applicable for the line defect repair of the small size, high resolution AMOLED display panel.

SUMMARY OF THE INVENTION

An objective of the present invention is to provide a repair structure of a line defect of an AMOLED display panel, which can utilize the present detecting circuit layout of the AMOLED display panel capable of introducing the repair line and saving the layout space, and has no additional requirement to the control IC, and particularly, can be applicable for the line defect repair of the small size, high resolution AMOLED display panel.

Another objective of the present invention is to provide a repair method of a line defect of an AMOLED display panel, which can save the layout space, and particularly, can be applicable for the line defect repair of the small size, high resolution AMOLED display panel.

For realizing the aforesaid objectives, the present invention first provides a repair structure of a line defect of an AMOLED display panel, comprising an AMOLED display panel detecting circuit, and a repair circuit which is directly grafted on the AMOLED display panel detecting circuit;

the AMOLED display panel detecting circuit comprises a plurality of signal lines, a plurality of signal fanout lines correspondingly coupled to the signal lines, a plurality of test TFTs correspondingly coupled to the signal lines, a test control line coupled to all the test TFTs and a plurality of test lines; the test TFT comprises a gate, a source, an active layer and a drain; the test control lines serve as gates of all the test TFTs, and the drain of one test TFT is correspondingly coupled to one signal line, and one test line is correspondingly coupled to sources of portion of the test TFTs;

the repair circuit comprises a plurality of conductive films and a plurality of repair lines; an amount of the conductive films and an amount of the test TFTs are equipotent, and one conductive film correspondingly overlaps and covers above one test TFT and is insulated from the test TFT; an amount of the repair lines and an amount of the test lines are equipotent, and one repair line is insulated and crossed with all the signal fanout lines and one corresponding test line.

The signal line is a data line or a scan line of the display panel.

The sources and the drains of the test TFTs and the signal lines are at the same layer.

The sources of all the test TFTs in charge of testing pixels of the same color are correspondingly coupled to one test line.

Material of the conductive films is transparent ITO, and material of the repair lines is conductive metal.

The present invention further provides a repair method of a line defect of an AMOLED display panel, comprising steps of:

step 1, providing an AMOLED display panel;

the AMOLED display panel comprises an AMOLED display panel detecting circuit, and a repair circuit which is directly grafted on the AMOLED display panel detecting circuit;

the AMOLED display panel detecting circuit comprises a plurality of signal lines, a plurality of signal fanout lines correspondingly coupled to the signal lines, a plurality of test TFTs correspondingly coupled to the signal lines, a test control line coupled to all the test TFTs and a plurality of test lines; the test TFT comprises a gate, a source, an active layer and a drain; the test control lines serve as gates of all the test TFTs, and the drain of one test TFT is correspondingly coupled to one signal line, and one test line is correspondingly coupled to sources of portion of the test TFTs;

the repair circuit comprises a plurality of conductive films and a plurality of repair lines; an amount of the conductive films and an amount of the test TFTs are equipotent, and one conductive film correspondingly overlaps and covers above one test TFT and is insulated from the test TFT; an amount of the repair lines and an amount of the test lines are equipotent, and one repair line is insulated and crossed with all the signal fanout lines and one corresponding test line;

step 2, laser cutting portions of the signal line at two sides of a defect point as some signal line appears the line defect, and a portion of the signal line which is previously coupled to the corresponding signal fanout line continues working normally;

step 3, respectively laser welding the source and the drain of the test TFT correspondingly coupled to the signal line, which appears the line defect, with the conductive film above the test TFT, and laser welding the test line coupled to the source of the test TFT with the repair line which is correspondingly insulated and crossed with the test line, and laser welding the repair line with an insulated and crossed point of the signal fanout line correspondingly coupled to the signal line which appears the line defect so that a portion of the signal line which is previously coupled to the corresponding test TFT continues working normally.

The signal line is a data line or a scan line of the display panel.

The sources and the drains of the test TFTs and the signal lines are at the same layer.

The sources of all the test TFTs in charge of testing pixels of the same color are correspondingly coupled to one test line.

Material of the conductive films is transparent ITO, and material of the repair lines is conductive metal.

The present invention further provides a repair structure of a line defect of an AMOLED display panel, comprising an AMOLED display panel detecting circuit, and a repair circuit which is directly grafted on the AMOLED display panel detecting circuit;

the AMOLED display panel detecting circuit comprises a plurality of signal lines, a plurality of signal fanout lines correspondingly coupled to the signal lines, a plurality of test TFTs correspondingly coupled to the signal lines, a test control line coupled to all the test TFTs and a plurality of test lines; the test TFT comprises a gate, a source, an active layer and a drain; the test control lines serve as gates of all the test TFTs, and the drain of one test TFT is correspondingly coupled to one signal line, and one test line is correspondingly coupled to sources of portion of the test TFTs;

the repair circuit comprises a plurality of conductive films and a plurality of repair lines; an amount of the conductive films and an amount of the test TFTs are equipotent, and one conductive film correspondingly overlaps and covers above one test TFT and is insulated from the test TFT; an amount of the repair lines and an amount of the test lines are equipotent, and one repair line is insulated and crossed with all the signal fanout lines and one corresponding test line;

wherein the signal line is a data line or a scan line of the display panel;

wherein the sources and the drains of the test TFTs and the signal lines are at the same layer.

The benefits of the present invention are: the present invention provides the repair structure of the line defect of the AMOLED display panel and the repair method, and the conductive film correspondingly overlaps and covers above the test TFT and is insulated from the test TFT, and the repair line is insulated and crossed with all the signal fanout lines and the corresponding test line. It is realized that the repair line is directly grafted on the AMOLED display panel detecting circuit, which can utilize the present detecting circuit layout of the AMOLED display panel capable of introducing the repair line for having the repair function and saving the layout space, and has no additional requirement to the control IC, and particularly, can be applicable for the line defect repair of the small size, high resolution AMOLED display panel.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
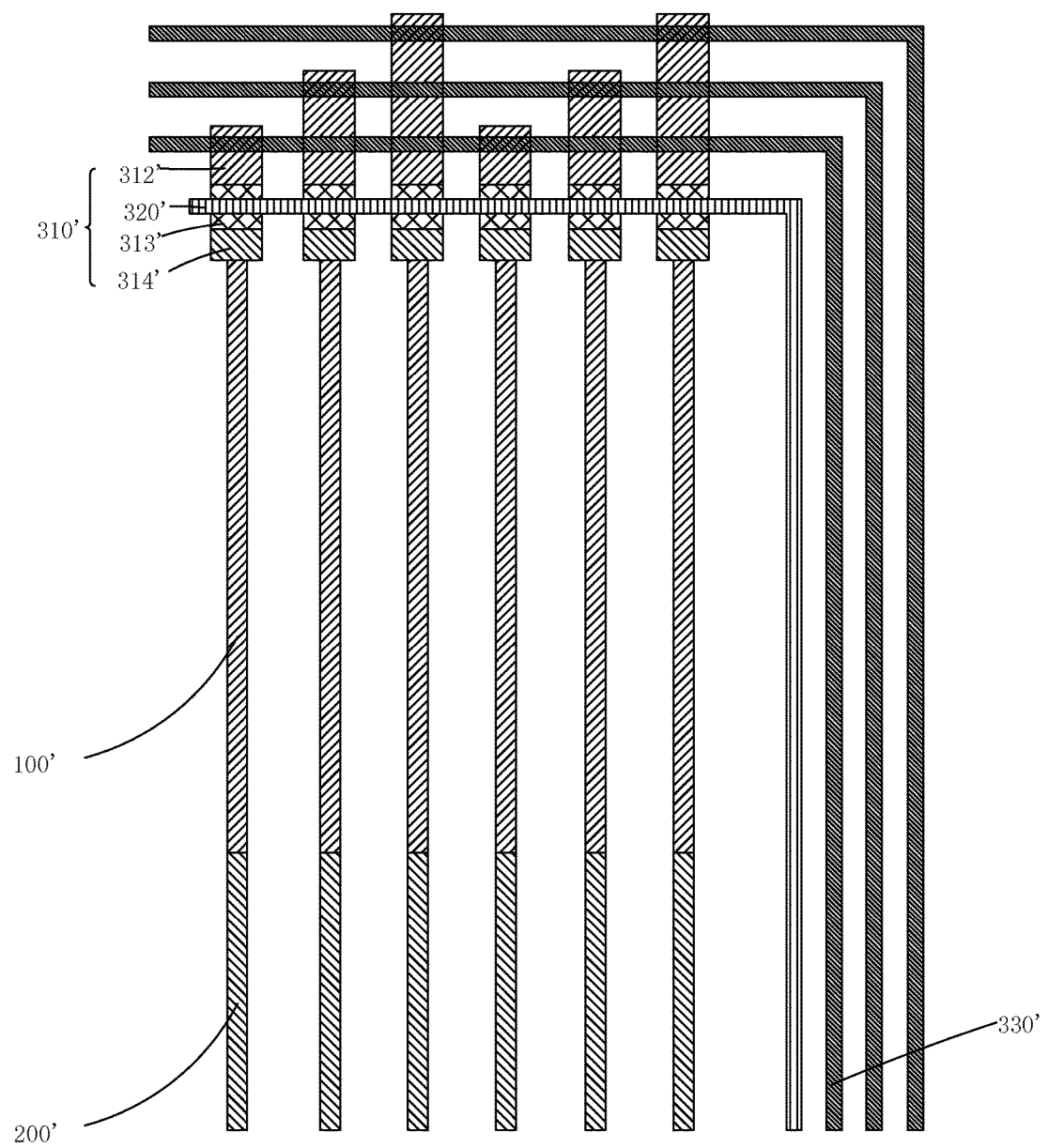
FIG. 1 is a diagram of a detecting circuit of an AMOLED display panel detecting circuit according to prior art.
Figure 2:
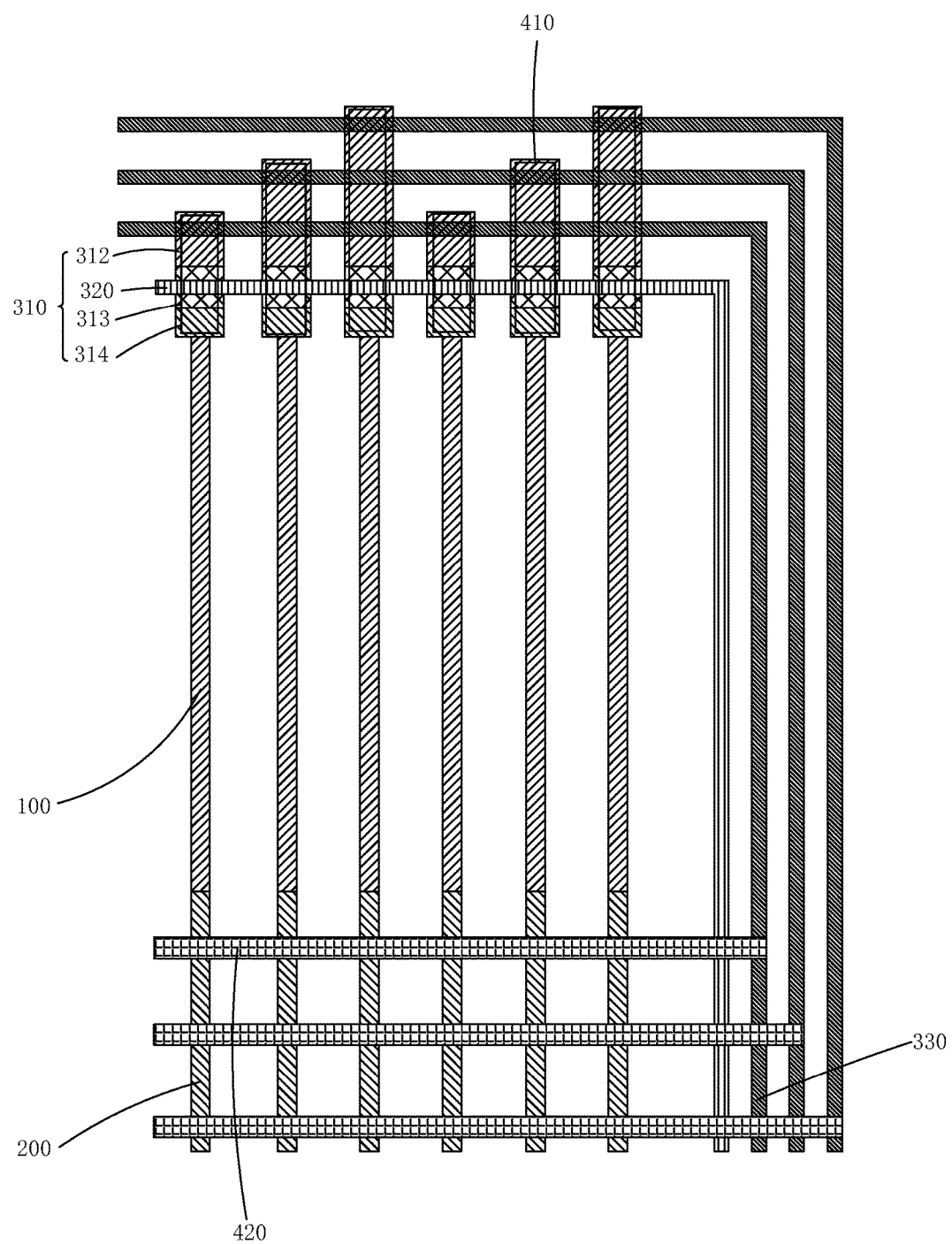
FIG. 2 is a diagram of a repair structure of a line defect of an AMOLED display panel according to the present invention.

Please refer to FIG. 2. The present invention first provides a repair structure of a line defect of an AMOLED display panel, comprising an AMOLED display panel detecting circuit, and a repair circuit which is directly grafted on the AMOLED display panel detecting circuit. Being directly grafted means that the repair line only occupies the present layout space of the AMOLED display panel detecting circuit, and not additional layout space is required, and the AMOLED display panel detecting circuit can be utilized for the line defect repair of the AMOLED display panel.

Specifically, as shown in FIG. 2, the AMOLED display panel detecting circuit comprises a plurality of signal lines 100, a plurality of signal fanout lines 200 correspondingly coupled to the signal lines 100, a plurality of test TFTs 310 correspondingly coupled to the signal lines 100, a test control line 320 coupled to all the test TFTs 310 and a plurality of test lines 330. The test TFT 310 comprises a gate, a source 312, an active layer 313 and a drain 314. The test control lines 310 serve as gates of all the test TFTs 310, and the drain 314 of one test TFT 310 is correspondingly coupled to one signal line 100, and one test line 330 is correspondingly coupled to sources 312 of portion of the test TFTs 310.

The repair circuit comprises a plurality of conductive films 410 and a plurality of repair lines 420. An amount of the conductive films 410 and an amount of the test TFTs 310 are equipotent, and one conductive film 410 correspondingly overlaps and covers above one test TFT 310 and is insulated from the test TFT 310; an amount of the repair lines 420 and an amount of the test lines 320 are equipotent, and one repair line 420 is insulated and crossed with all the signal fanout lines 200 and one corresponding test line 330.

Furthermore, the signal line 100 is a data line or a scan line of the display panel.

For convenience of manufacture, the sources 312 and the drains 314 of the test TFTs 310 and the signal lines 100 are at the same layer; the sources 312 of all the test TFTs 310 in charge of testing pixels of the same color are correspondingly coupled to one test line 330, and as illustrations, the sources 312 of all the test TFTs 310 in charge of testing pixels of the red color are correspondingly coupled to the first test line 330, and the sources 312 of all the test TFTs 310 in charge of testing pixels of the green color are correspondingly coupled to the second test line 330, and the sources 312 of all the test TFTs 310 in charge of testing pixels of the blue color are correspondingly coupled to the third test line 330.

Both the test control line 320 and the test line 330 appear to be upside down L shape, and both comprise the line section parallel with the signal line 100 and employed to be insulated and crossed with the repair line 420, and the line section perpendicular with the signal line 100 and employed to be coupled to the test TFT 310. The extension direction of the repair line 420 is perpendicular with the extension direction of the signal fanout line 200, and the two are perpendicular, and insulated and crossed with each other.

Material of the conductive film is preferably to be Indium Tin Oxide (ITO), and material of the repair line is preferably to be conductive metal, such as molybdenum, titanium, aluminum and copper.

As the AMOLED display panel detecting circuit performs the detection, the test control line 320 receives the test control signal provided by the panel test terminal and activates all the test TFTs 310. Meanwhile, the test line 330 receives the test signal provided by the panel test terminal, and transmits the same to the corresponding signal line 100 through the test TFT 310 for testing whether the panel works normally or not. As the detection is finished, the panel test terminal stops providing the test control signal and the test signal. The test control signal line 320 receives no signal and the test TFT 310 is deactivated. The signal line 100 transmits the display signal and the display panel normally displays.

Figure 3:
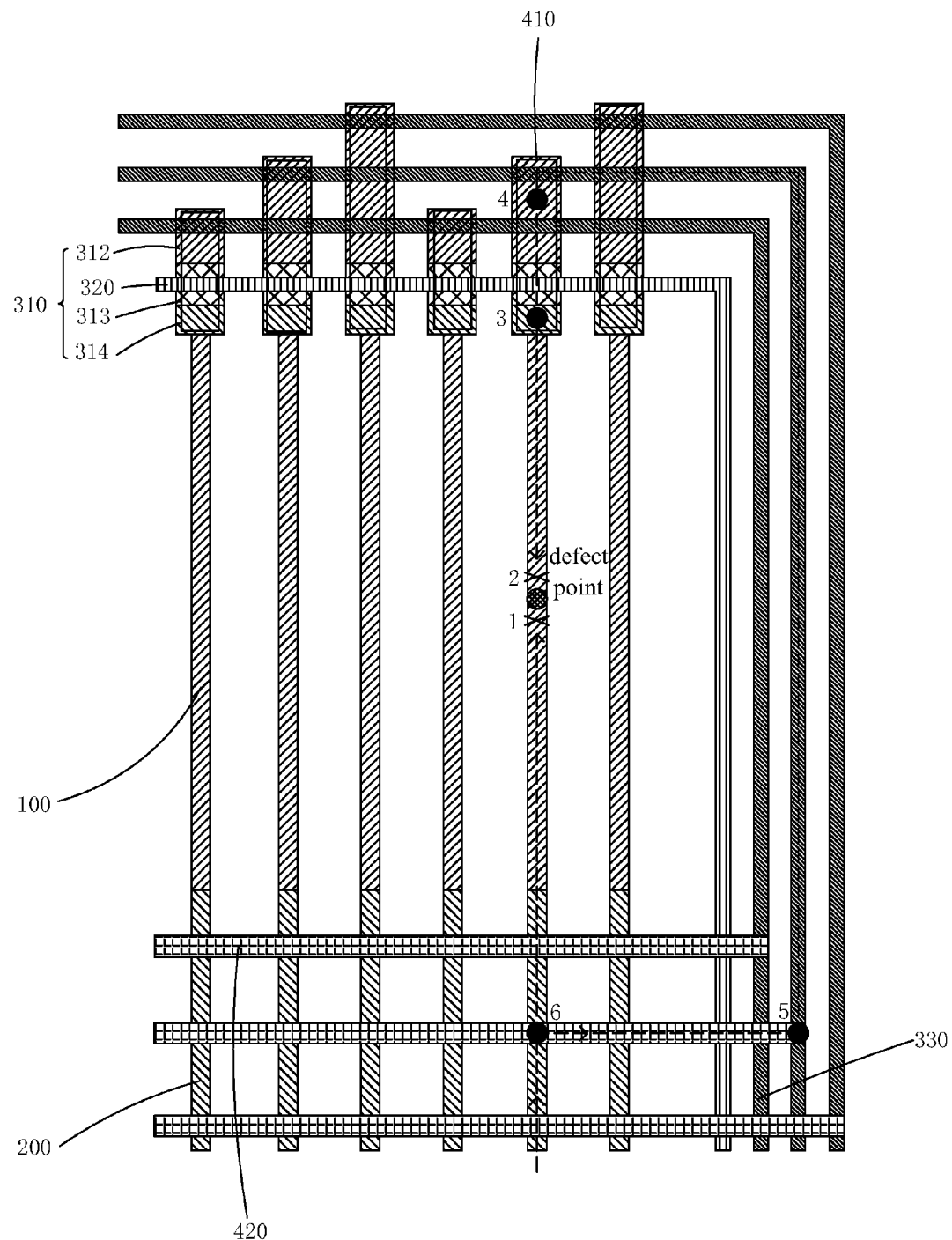
FIG. 3 is a diagram of repairing the line defect of the AMOLED display panel according to the present invention.

With combination of FIG. 3, as some signal line 100 of the AMOLED display panel appears the line defect in the display process: laser cutting portions of the signal line 100 at two sides of a defect point (positions 1, 2 in FIG. 3), and a portion of the signal line 100 which is previously coupled to the corresponding signal fanout line 200 continues working normally; respectively laser welding the source 312 and the drain 314 of the test TFT 310 correspondingly coupled to the signal line 100, which appears the line defect, with the conductive film 410 above the test TFT 310 (positions 3, 4 in FIG. 3), and laser welding the test line 330 coupled to the source 312 of the test TFT 310 with the repair line 420 which is correspondingly insulated and crossed with the test line 330 (position 5 in FIG. 3), and laser welding the repair line 330 with an insulated and crossed point of the signal fanout line 200 correspondingly coupled to the signal line 100 which appears the line defect (position 6 in FIG. 3). The display signal is transmitted to the portion of the signal line 100, which is previously coupled to the corresponding test TFT 310 through the corresponding signal fanout line 200, test line 330, source 312 of test TFT 310, conductive film 410, drain 314 of test TFT 310 so that the test TFT works normally to accomplish the repair to the line defect.

In the repair structure of the line defect of the AMOLED display panel according to the present invention, the repair circuit is directly grafted on the AMOLED display panel detecting circuit, which can utilize the present detecting circuit layout of the AMOLED display panel capable of introducing the repair line for having the repair function and saving the layout space, and has no additional requirement to the control IC, and particularly, can be applicable for the line defect repair of the small size, high resolution AMOLED display panel.

On the basis of the same inventive idea, the present invention further provides a repair method of a line defect of an AMOLED display panel, comprising steps of:

step 1, providing an AMOLED display panel.

The AMOLED display panel comprises an AMOLED display panel detecting circuit, and a repair circuit which is directly grafted on the AMOLED display panel detecting circuit. Being directly grafted means that the repair line only occupies the present layout space of the AMOLED display panel detecting circuit, and not additional layout space is required, and the AMOLED display panel detecting circuit can be utilized for the line defect repair of the AMOLED display panel.

Specifically, as shown in FIG. 2, the AMOLED display panel detecting circuit comprises a plurality of signal lines 100, a plurality of signal fanout lines 200 correspondingly coupled to the signal lines 100, a plurality of test TFTs 310 correspondingly coupled to the signal lines 100, a test control line 320 coupled to all the test TFTs 310 and a plurality of test lines 330. The test TFT 310 comprises a gate, a source 312, an active layer 313 and a drain 314. The test control lines 310 serve as gates of all the test TFTs 310, and the drain 314 of one test TFT 310 is correspondingly coupled to one signal line 100, and one test line 330 is correspondingly coupled to sources 312 of portion of the test TFTs 310.

The repair circuit comprises a plurality of conductive films 410 and a plurality of repair lines 420. An amount of the conductive films 410 and an amount of the test TFTs 310 are equipotent, and one conductive film 410 correspondingly overlaps and covers above one test TFT 310 and is insulated from the test TFT 310; an amount of the repair lines 420 and an amount of the test lines 320 are equipotent, and one repair line 420 is insulated and crossed with all the signal fanout lines 200 and one corresponding test line 330.

Furthermore, the signal line 100 is a data line or a scan line of the display panel.

For convenience of manufacture, the sources 312 and the drains 314 of the test TFTs 310 and the signal lines 100 are at the same layer; the sources 312 of all the test TFTs 310 in charge of testing pixels of the same color are correspondingly coupled to one test line 330, and as illustrations, the sources 312 of all the test TFTs 310 in charge of testing pixels of the red color are correspondingly coupled to the first test line 330, and the sources 312 of all the test TFTs 310 in charge of testing pixels of the green color are correspondingly coupled to the second test line 330, and the sources 312 of all the test TFTs 310 in charge of testing pixels of the blue color are correspondingly coupled to the third test line 330.

Both the test control line 320 and the test line 330 appear to be upside down L shape, and both comprise the line section parallel with the signal line 100 and employed to be insulated and crossed with the repair line 420, and the line section perpendicular with the signal line 100 and employed to be coupled to the test TFT 310. The extension direction of the repair line 420 is perpendicular with the extension direction of the signal fanout line 200, and the two are perpendicular, and insulated and crossed with each other.

Material of the conductive film is preferably to be ITO, and material of the repair line is preferably to be conductive metal, such as molybdenum, titanium, aluminum and copper.

step 2, laser cutting portions of the signal line 100 at two sides of a defect point (positions 1, 2 in FIG. 3) as some signal line 100 appears the line defect, and a portion of the signal line 100 which is previously coupled to the corresponding signal fanout line 200 continues working normally.

step 3, respectively laser welding the source 312 and the drain 314 of the test TFT 310 correspondingly coupled to the signal line 100, which appears the line defect, with the conductive film 410 above the test TFT 310 (positions 3, 4 in FIG. 3), and laser welding the test line 330 coupled to the source 312 of the test TFT 310 with the repair line 420 which is correspondingly insulated and crossed with the test line 330 (position 5 in FIG. 3), and laser welding the repair line 330 with an insulated and crossed point of the signal fanout line 200 correspondingly coupled to the signal line 100 which appears the line defect (position 6 in FIG. 3). The display signal is transmitted to the portion of the signal line 100, which is previously coupled to the corresponding test TFT 310 through the corresponding signal fanout line 200, test line 330, source 312 of test TFT 310, conductive film 410, drain 314 of test TFT 310 so that the test TFT works normally to accomplish the repair to the line defect.

In the repair method of the line defect of the AMOLED display panel according to the present invention, the repair circuit is directly grafted on the AMOLED display panel detecting circuit, which can utilize the present detecting circuit layout of the AMOLED display panel capable of introducing the repair line for having the repair function and saving the layout space, and has no additional requirement to the control IC, and particularly, can be applicable for the line defect repair of the small size, high resolution AMOLED display panel.

In conclusion, in the repair structure of the line defect of the AMOLED display panel and the repair method according to the present invention, the conductive film correspondingly overlaps and covers above the test TFT and is insulated from the test TFT, and the repair line is insulated and crossed with all the signal fanout lines and the corresponding test line. It is realized that the repair line is directly grafted on the AMOLED display panel detecting circuit, which can utilize the present detecting circuit layout of the AMOLED display panel capable of introducing the repair line for having the repair function and saving the layout space, and has no additional requirement to the control IC, and particularly, can be applicable for the line defect repair of the small size, high resolution AMOLED display panel.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A repair structure of a line defect of an AMOLED display panel, comprising an AMOLED display panel detecting circuit, and a repair circuit which is directly grafted on the AMOLED display panel detecting circuit;

the AMOLED display panel detecting circuit comprises a plurality of signal lines, a plurality of signal fanout lines correspondingly coupled to the signal lines, a plurality of test TFTs correspondingly coupled to the signal lines, a test control line coupled to all the test TFTs and a plurality of test lines; the test TFT comprises a gate, a source, an active layer and a drain; the test control lines serve as gates of all the test TFTs, and the drain of one test TFT is correspondingly coupled to one signal line, and one test line is correspondingly coupled to sources of portion of the test TFTs;

the repair circuit comprises a plurality of conductive films and a plurality of repair lines; an amount of the conductive films and an amount of the test TFTs are equipotent, and one conductive film correspondingly overlaps and covers above one test TFT and is insulated from the test TFT; an amount of the repair lines and an amount of the test lines are equipotent, and one repair line is insulated and crossed with all the signal fanout lines and one corresponding test line.

2. The repair structure of the line defect of the AMOLED display panel according to claim 1, wherein the signal line is a data line or a scan line of the display panel.

3. The repair structure of the line defect of the AMOLED display panel according to claim 1, wherein the sources and the drains of the test TFTs and the signal lines are at the same layer.

4. The repair structure of the line defect of the AMOLED display panel according to claim 2, wherein the sources of all the test TFTs in charge of testing pixels of the same color are correspondingly coupled to one test line.

5. The repair structure of the line defect of the AMOLED display panel according to claim 1, wherein material of the conductive films is transparent ITO, and material of the repair lines is conductive metal.

6. A repair method of a line defect of an AMOLED display panel, comprising steps of:

step 1, providing an AMOLED display panel;
the AMOLED display panel comprises an AMOLED display panel detecting circuit, and a repair circuit which is directly grafted on the AMOLED display panel detecting circuit;
the AMOLED display panel detecting circuit comprises a plurality of signal lines, a plurality of signal fanout lines correspondingly coupled to the signal lines, a plurality of test TFTs correspondingly coupled to the signal lines, a test control line coupled to all the test TFTs and a plurality of test lines; the test TFT comprises a gate, a source, an active layer and a drain; the test control lines serve as gates of all the test TFTs, and the drain of one test TFT is correspondingly coupled to one signal line, and one test line is correspondingly coupled to sources of portion of the test TFTs;
the repair circuit comprises a plurality of conductive films and a plurality of repair lines; an amount of the conductive films and an amount of the test TFTs are equipotent, and one conductive film correspondingly overlaps and covers above one test TFT and is insulated from the test TFT; an amount of the repair lines and an amount of the test lines are equipotent, and one repair line is insulated and crossed with all the signal fanout lines and one corresponding test line;
step 2, laser cutting portions of the signal line at two sides of a defect point as some signal line appears the line defect, and a portion of the signal line which is previously coupled to the corresponding signal fanout line continues working normally;

step 3, respectively laser welding the source and the drain of the test TFT correspondingly coupled to the signal line, which appears the line defect, with the conductive film above the test TFT, and laser welding the test line coupled to the source of the test TFT with the repair line which is correspondingly insulated and crossed with the test line, and laser welding the repair line with an insulated and crossed point of the signal fanout line correspondingly coupled to the signal line which appears the line defect so that a portion of the signal line which is previously coupled to the corresponding test TFT continues working normally.

7. The repair method of the line defect of the AMOLED display panel according to claim 6, wherein the signal line is a data line or a scan line of the display panel.

8. The repair method of the line defect of the AMOLED display panel according to claim 6, wherein the sources and the drains of the test TFTs and the signal lines are at the same layer.

9. The repair method of the line defect of the AMOLED display panel according to claim 7, wherein the sources of all the test TFTs in charge of testing pixels of the same color are correspondingly coupled to one test line.

10. The repair method of the line defect of the AMOLED display panel according to claim 7, wherein material of the conductive films is transparent ITO, and material of the repair lines is conductive metal.

11. A repair structure of a line defect of an AMOLED display panel, comprising an AMOLED display panel detecting circuit, and a repair circuit which is directly grafted on the AMOLED display panel detecting circuit;

the AMOLED display panel detecting circuit comprises a plurality of signal lines, a plurality of signal fanout lines correspondingly coupled to the signal lines, a plurality of test TFTs correspondingly coupled to the signal lines, a test control line coupled to all the test TFTs and a plurality of test lines; the test TFT comprises a gate, a source, an active layer and a drain; the test control lines serve as gates of all the test TFTs, and the drain of one test TFT is correspondingly coupled to one signal line, and one test line is correspondingly coupled to sources of portion of the test TFTs;

the repair circuit comprises a plurality of conductive films and a plurality of repair lines; an amount of the conductive films and an amount of the test TFTs are equipotent, and one conductive film correspondingly overlaps and covers above one test TFT and is insulated from the test TFT; an amount of the repair lines and an amount of the test lines are equipotent, and one repair line is insulated and crossed with all the signal fanout lines and one corresponding test line;

wherein the signal line is a data line or a scan line of the display panel;

wherein the sources and the drains of the test TFTs and the signal lines are at the same layer.

12. The repair structure of the line defect of the AMOLED display panel according to claim 11, wherein the sources of all the test TFTs in charge of testing pixels of the same color are correspondingly coupled to one test line.

13. The repair structure of the line defect of the AMOLED display panel according to claim 11, wherein material of the conductive films is transparent ITO, and material of the repair lines is conductive metal.

* * * * *